United States Patent

Arai

[11] Patent Number: 6,111,274
[45] Date of Patent: Aug. 29, 2000

[54] INORGANIC LIGHT EMITTING DIODE

[75] Inventor: Michio Arai, Tokyo, Japan

[73] Assignee: TDK Corporation, Tokyo, Japan

[21] Appl. No.: 09/339,879

[22] Filed: Jun. 25, 1999

[30] Foreign Application Priority Data

May 27, 1999 [JP] Japan ................................ 11-148796

[51] Int. Cl.$^7$ .......................... H01L 33/00; H05B 33/00
[52] U.S. Cl. .......................... 257/96; 257/103; 313/502; 313/503; 313/509
[58] Field of Search ................................ 257/94, 96, 103; 313/498, 502, 503, 509; 428/917, 690

[56] References Cited

U.S. PATENT DOCUMENTS

| | | | |
|---|---|---|---|
| 5,554,449 | 9/1996 | Tonomura et al. | 428/690 |
| 5,589,733 | 12/1996 | Noda et al. | 313/509 |
| 5,625,255 | 4/1997 | Watanabe | 313/506 |
| 5,675,217 | 10/1997 | Kang | 313/509 |
| 5,952,779 | 9/1999 | Arai et al. | 313/504 |
| 5,969,474 | 10/1999 | Arai | 313/504 |

FOREIGN PATENT DOCUMENTS

| | | |
|---|---|---|
| 58-73394 | 5/1983 | Japan . |
| 62-13357 | 4/1987 | Japan . |
| 3-210791 | 9/1991 | Japan . |
| 4-363892 | 12/1992 | Japan . |
| 5-41285 | 2/1993 | Japan . |
| 6-163158 | 6/1994 | Japan . |
| 8-288069 | 11/1996 | Japan . |
| 10-125474 | 5/1998 | Japan . |

Primary Examiner—John Guay
Attorney, Agent, or Firm—Oblon, Spivak, McClelland, Maier & Neustadt, P.C.

[57] ABSTRACT

An object of the invention is to provide a light emitting diode which enables relatively easy fabrication of large-area displays and is applicable to thin, long life, low cost, full color displays too. The object is attained by a light emitting diode comprising a positive electrode, a negative electrode, an inorganic light emitting layer between the electrodes exhibiting at least electroluminescence, an inorganic electron transporting layer between the inorganic light emitting layer and the negative electrode comprising as a main component at least one oxide selected from among strontium oxide, magnesium oxide, calcium oxide, lithium oxide, rubidium oxide, potassium oxide, sodium oxide, and cesium oxide, and an inorganic hole transporting layer between the inorganic light emitting layer and the positive electrode, the inorganic hole transporting layer being an inorganic insulative hole transporting layer comprising an oxide of silicon and/or germanium as a main component.

13 Claims, 1 Drawing Sheet

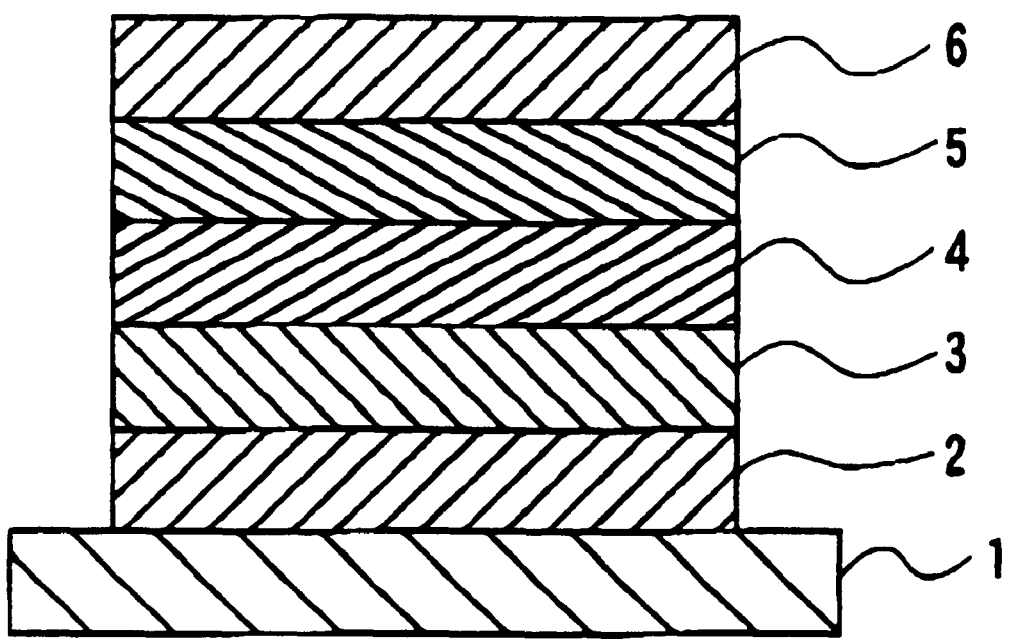

INORGANIC LIGHT EMITTING DIODE

BACKGROUND OF THE INVENTION

1. Technical Field

This invention relates to light emitting diodes (LED) and more particularly, to devices having the inorganic thin film structure that an inorganic fluorescent substance between a pair of electrodes emits light.

2. Background Art

In recent years, light emitting devices have made a great advance. In particular, active research and development efforts are made on the following two subjects. The first relates to light emitting diodes (LED) and laser diodes (LD) relying as the basic principle on the injection and radiative recombination of electrons and holes across a semiconductor pn junction. The second relates to organic electroluminescent (EL) cells relying on the basic principle that an organic thin film serving as a light emitting layer is stacked along with electron transporting and hole transporting organic substances to accomplish injection and radiative recombination of electrons and holes similar to the semiconductor pn junction.

The LED and LD have long been studied while the research of GaN and ZnSe systems has marked a great advance in recent years. As shown in Nikkei Electronics, No. 674, page 79 (1996), for example, LEDs including a layered structure of such nitride semiconductor layers and emitting blue, green or similar light of short wavelength have already been developed. At present, reports relating to LD are also found though they are at an experimental phase. The reason why the LED and LD required a long time of development is that wide gap semiconductor materials such as GaN and ZnSe were easy to form n-type semiconductors, but difficult to form p-type semiconductors. With the progress of their crystal growth technology, the successful manufacture of p-type semiconductors was reported in recent years, which encouraged a rapid advance to realize LED and then LD.

However, LED and LD are difficult to apply as surface-emitting devices. Even if surface-emitting devices can be constructed, they become very expensive, suffering from a disadvantage from the price viewpoint. In the mass manufacture of blue-emitting devices, the crystal growth conditions, equipment, and single crystal substrates used are undesirably very costly as compared with red LEDs. It is currently believed that the market of blue-emitting devices expands 5 times if their cost is reduced to one half. It is urgently demanded to reduce the cost and improve the production yield of the relevant technology.

On the other hand, the organic EL devices can be formed on glass to a large area, on account of which research and development efforts have been made thereon to realize displays. In general, organic EL devices have a basic configuration constructed by forming a transparent electrode of ITO etc. on a glass substrate, stacking thereon a hole injecting and transporting layer of an organic amine compound and a light emitting layer of an organic substance exhibiting electron conductivity and intense light emission such as Alq3, and further forming an electrode of a low work function metal such as MgAg, The device configurations which have been reported thus far have one or more organic compound layers interposed between a hole injecting electrode and an electron injecting electrode. The organic compound layers are typically of two- or three-layer structure.

In either structure, however, an unstable metal material having a low work function must be used as one of the electrodes (usually on the electron injecting side). None of the devices available thus far are satisfactory in device lifetime, luminous efficiency, ease of production, production cost, ease of handling and the like.

Since electroluminescent (EL) devices are light emitting devices having a thin fluorescent substance layer sandwiched between dielectric layers, they have several features including ease of handling of inorganic material, a wide angle of view, and a long lifetime. Further development of the device is expected.

However, since the luminous wavelength of the fluorescent substance used in EL is limited, the luminous wavelength band of EL devices is restricted, leaving the problem that a full color display and a specific color cannot be obtained. Inorganic fluorescent materials are difficult to provide a sufficient luminous efficiency, which becomes a serious obstacle to increasing the emission luminance and reducing the power consumption of devices. Further, the difficult adjustment of a fluorescent material makes difficult the representation of a subtle color and the application to large-area displays.

SUMMARY OF THE INVENTION

An object of the invention is to provide a light emitting diode which enables relatively easy fabrication of large-area displays and is applicable to thin, long life, low cost, full color displays too.

This and other objects can be accomplished by the following constructions.

(1) A light emitting diode comprising a positive electrode, a negative electrode, an inorganic light emitting layer disposed between the electrodes exhibiting at least electroluminescence, an inorganic insulative electron injecting and transporting layer disposed between the inorganic light emitting layer and the negative electrode and comprising as main component at least one oxide selected from the group consisting of strontium oxide, magnesium oxide, calcium oxide, lithium oxide, rubidium oxide, potassium oxide, sodium oxide, and cesium oxide, and an inorganic hole injecting and transporting layer disposed between the inorganic light emitting layer and the positive electrode, the inorganic hole injecting and transporting layer being an inorganic insulative hole injecting and transporting layer comprising an oxide of silicon and/or germanium as a main component.

(2) The light emitting diode of (1) wherein the main component has an average composition represented by $(Si_{1-x}Ge_x)O_y$ wherein $0 \leq x \leq 1$ and $1.7 \leq y \leq 1.99$.

(3) The light emitting diode of (1) wherein the inorganic insulative electron injecting and transporting layer further contains silicon oxide ($SiO_2$) and/or germanium oxide ($GeO_2$) as a stabilizer.

(4) The light emitting diode of (1) wherein the inorganic insulative electron injecting and transporting layer contains 80 to 99 mol % of the main component and 1 to 20 mol % of the stabilizer, based on the entire components.

(5) The light emitting diode of (1) wherein the inorganic insulative electron injecting and transporting layer has a thickness of 0.1 to 2 nm.

(6) The light emitting diode of (1) wherein the inorganic insulative hole injecting and transporting layer has a thickness of 0.1 to 3 nm.

(7) The light emitting diode of (1) wherein the inorganic hole injecting and transporting layer is a high resistance inorganic hole injecting and transporting layer having a resistivity of 1 to $1\times10^{11}$ Ω-cm.

(8) The light emitting diode of (7) wherein the high resistance inorganic hole injecting and transporting layer contains a metal and/or at least one member selected from the group consisting of an oxide, carbide, nitride, silicide and boride of the metal.

(9) The light emitting diode of (7) wherein the high resistance inorganic hole injecting and transporting layer contains an oxide of silicon and/or germanium as a main component, the main component being represented by $(Si_{1-x}Ge_x)O_y$ wherein $0 \leq x \leq 1$ and $1.7 \leq y \leq 2.2$, and a metal having a work function of at least 4.5 eV and/or at least one member selected from the group consisting of an oxide, carbide, nitride, silicide and boride of the metal.

(10) The light emitting diode of (9) wherein the metal is at least one member selected from the group consisting of Au, Cu, Fe, Ni, Ru, Sn, Cr, Ir, Nb, Pt, W, Mo, Ta, Pd, and Co.

(11) The light emitting diode of (9) wherein the content of the metal and/or the oxide, carbide, nitride, silicide and boride of the metal is 0.2 to 40 mol %.

(12) The light emitting diode of (9) wherein the high resistance inorganic hole injecting and transporting layer has a thickness of 0.2 to 100 nm.

(13) The light emitting diode of (1) wherein the inorganic light emitting layer contains at least strontium sulfide and cesium.

BRIEF DESCRIPTION OF THE DRAWING

FIG. 1 is a schematic cross-sectional view showing the basic construction of a light emitting diode according to the invention.

DESCRIPTION OF THE PREFERRED EMBODIMENTS

The light emitting diode of the invention has a positive electrode, a negative electrode, an inorganic light emitting layer disposed between the electrodes exhibiting at least electroluminescence, an inorganic electron injecting and transporting layer disposed between the inorganic light emitting layer and the negative electrode and comprising as a main component at least one oxide selected from among strontium oxide, magnesium oxide, calcium oxide, lithium oxide, rubidium oxide, potassium oxide, sodium oxide, and cesium oxide, and an inorganic hole injecting and transporting layer disposed between the inorganic light emitting layer and the positive electrode. The inorganic hole injecting and transporting layer is an inorganic insulative hole injecting and transporting layer comprising an oxide of silicon and/or germanium as a main component.

By disposing an electroluminescent inorganic light emitting layer between an inorganic insulative electron injecting and transporting layer having an electron injecting and transporting function and an inorganic insulative hole injecting and transporting layer having a hole injecting and transporting function in this way, an inexpensive LED applicable to a large-area display can be constructed. Since its manufacture by thin film-forming steps is possible, there is available a display having a high degree of freedom in the design of a display surface shape, a thin wall and a long lifetime.

The negative electrode (or electron injecting electrode) is preferably formed of materials having a low work function, for example, metal elements such as K, Li, Na, Mg, La, Ce, Ca, Sr, Ba, Al, Ag, In, Sn, Zn, and Zr, and binary or ternary alloys containing such metal elements for stability improvement, and oxides of these metal elements. Also useful are oxides and fluorides of alkali metal elements such as Li, Na, K, Rb, and Cs. Exemplary alloys include Ag—Mg (Ag: 0.1 to 50 at %), Al—Li (Li: 0.01 to 12 at %), In—Mg (Mg: 50 to 80 at %), and Al—Ca (Ca: 0.01 to 20 at %). A thin film of one of these materials or a multilayer thin film of two or more of these materials may be used as the electron injecting electrode layer.

The negative electrode (or electron injecting electrode) thin film may have at least a sufficient thickness to effect electron injection, for example, a thickness of at least 0.1 nm, preferably at least 0.5 nm, more preferably at least 1 nm. Although the upper limit is not critical, the film thickness is typically about 1 to about 500 nm. On the negative electrode, an auxiliary or protective electrode may be provided.

The auxiliary electrode may have at least a sufficient thickness to ensure efficient electron injection and prevent the ingress of moisture, oxygen and organic solvents, for example, a thickness of at least 50 nm, preferably at least 100 nm, more preferably 100 to 500 nm. A too thin auxiliary electrode layer would exert its effect little, lose a step coverage capability, and provide insufficient connection to a terminal electrode. If too thick, greater stresses are generated in the auxiliary electrode layer, bringing about a detrimental effect such as the accelerated growth rate of dark spots.

For the auxiliary electrode, an appropriate material may be chosen in consideration of the material of the electron injecting electrode to be combined therewith. For example, low resistivity metals such as aluminum may be used when electron injection efficiency is of importance. Metal compounds such as TiN may be used when sealing is of importance.

The thickness of the negative electrode and the auxiliary electrode combined is usually about 50 to about 500 nm though it is not critical.

For the positive electrode (or hole injecting electrode), materials capable of effectively injecting holes into the high resistance inorganic hole injecting layer are preferred, with those materials having a work function of 4.5 to 5.5 eV being especially preferred. Useful are compositions based on tin-doped indium oxide (ITO), zinc-doped indium oxide (IZO), indium oxide ($In_2O_3$), tin oxide ($SnO_2$) or zinc oxide (ZnO). These oxides may deviate more or less from their stoichiometric compositions. An appropriate proportion of $SnO_2$ mixed with $In_2O_3$ is about 1 to 20%, more preferably about 5 to 12% by weight. For IZO, an appropriate proportion of ZnO mixed with $In_2O_3$ is about 12 to 32% by weight.

The positive electrode (or hole injecting electrode) may further contain silicon oxide ($SiO_2$) for adjusting the work function. The content of silicon oxide ($SiO_2$) is preferably about 0.5 to 10% as expressed in mol percent of $SiO_2$ based on ITO. The work function of ITO is increased by incorporating $SiO_2$.

The electrode on the light output side should preferably have a light transmittance of at least 50%, more preferably at least 80%, further preferably at least 90% in the light emission band, typically from 400 to 700 nm, and especially at each light emission. With a lower transmittance, the light emitted by the light emitting layer is attenuated through the electrode, failing to provide a luminance necessary as a light emitting device.

Preferably the electrode has a thickness of 50 to 500 nm, especially 50 to 300 nm. Although the upper limit of the electrode thickness is not critical, a too thick electrode would cause a drop of transmittance and separation. Too thin an electrode is insufficient for its effect and low in film strength during fabrication.

The light emitting diode of the invention has an inorganic insulative electron injecting and transporting layer between the inorganic light emitting layer and the negative electrode.

By providing an inorganic insulative electron injecting and transporting layer of an inorganic material in this way, the physical properties at the interface between the electrode or inorganic light emitting layer and the inorganic electron injecting and transporting layer are stabilized, and the light emitting diode is improved in durability and weather resistance and becomes easy to fabricate. The light emitting diode provides a luminance equal to or greater than prior art organic EL devices and LEDs and have higher heat resistance and weather resistance so that it has a longer lifetime than the prior art devices and is devoid of current leakage or dark spots. Since an inexpensive, readily available inorganic material is used rather than a relatively expensive organic material, the manufacture becomes easy and the manufacturing cost can be reduced.

The inorganic insulative electron injecting and transporting layer has the functions of facilitating injection of electrons from the negative electrode, transporting electrons stably, and blocking holes. This layer is effective for increasing the number of holes and electrons injected into the light emitting layer and confining holes and electrons therein for optimizing the recombination region to improve luminous efficiency.

The inorganic insulative electron injecting and transporting layer, which is composed of the above-described main and other components, eliminates a need to form a special electrode having an electron injecting function and permits a metal electrode having relatively high stability and good conductivity to be used. And the electron injecting and transporting efficiency of the inorganic insulative electron injecting and transporting layer is improved, and the lifetime of the device is prolonged.

The inorganic insulative electron injecting and transporting layer contains at least one oxide selected from the group consisting of lithium oxide ($Li_2O$), rubidium oxide ($Rb_2O$), potassium oxide ($K_2O$), sodium oxide ($Na_2O$), cesium oxide ($Cs_2O$), strontium oxide (SrO), magnesium oxide (MgO), and calcium oxide (CaO) as the main component. These oxides may be used alone or in admixture of two or more. The mixture of two or more oxides may have an arbitrary mix ratio. Of these oxides, strontium oxide is most preferred, while magnesium oxide, calcium oxide and lithium oxide ($Li_2O$) are next preferred in the described order, and next to them, rubidium oxide ($Rb_2O$), potassium oxide ($K_2O$) and sodium oxide ($Na_2O$) are preferred. When these oxides are used in admixture, the mixture should preferably contain at least 40 mol % of strontium oxide or at least 40 mol %, especially at least 50 mol % of lithium oxide and rubidium oxide combined.

Preferably the inorganic insulative electron injecting and transporting layer contains silicon oxide ($SiO_2$) and/or germanium oxide ($GeO_2$) as the stabilizer. Either one or both of silicon oxide and germanium oxide may be used. The mixture of silicon oxide and germanium oxide may have an arbitrary mix ratio.

These oxides are generally present in stoichiometric composition, but may deviate more or less therefrom and take a non-stoichiometric composition.

Also preferably, the inorganic insulative electron injecting and transporting layer according to the invention contains the respective components in the following amounts:

main component: 80 to 90 mol %, more preferably 90 to 95 mol %, and stabilizer: 1 to 20 mol %, more preferably 5 to 10 mol %, based on the entire components, provided that the respective components are calculated as SrO, MgO, CaO, $Li_2O$, $Rb_2O$, $K_2O$, $Na_2O$, $Cs_2O$, $SiO_2$, and $GeO_2$.

The thickness of the inorganic insulative electron injecting and transporting layer is preferably about 0.1 to 2 nm, especially about 0.3 to 0.8 nm. Outside the range, the electron injecting layer would fail to fully exert its own function.

In addition, the inorganic insulative electron injecting and transporting layer may contain as impurities H and Ne, Ar, Kr or Xe used as the sputtering gas, preferably in a total content of up to 5 at %.

As long as the overall inorganic insulative electron injecting and transporting layer has the above-described composition on the average, the composition of the layer need not be uniform. A layer structure having a graded concentration in a thickness direction is acceptable.

The inorganic insualtive electron injecting and transporting layer is normally amorphous.

Methods for preparing the inorganic insulative electron injecting and transporting layer include various physical and chemical thin film formation methods such as sputtering and evaporation, with the sputtering being preferred. In particular, a multi-source sputtering process of sputtering distinct targets of the first and second components is preferred. The multi-source sputtering process allows the respective targets to be sputtered by appropriate techniques. In the case of single-source sputtering, a target of a mixture of the first and second components may be used.

When the inorganic insulative electron injecting and transporting layer is formed by sputtering, the sputtering gas is preferably under a pressure of 0.1 to 1 Pa during sputtering. The sputtering gas may be an inert gas such as Ar, Ne, Xe or Kr as used in conventional sputtering apparatus. Nitrogen ($N_2$) may be used if desired. As to the sputtering atmosphere, about 1 to 99% of oxygen ($O_2$) may be added to or mixed with the sputtering gas to carry out reactive sputtering.

The sputtering process may be a high-frequency sputtering process using an RF power supply or a dc sputtering process. The power to the sputtering apparatus is preferably in the range of about 0.1 to 10 W/cm² for RF sputtering. The rate of film deposition is preferably in the range of 0.5 to 10 nm/min, especially 1 to 5 nm/min.

During deposition, the temperature of the substrate is room temperature (25° C.) to about 150° C.

The light emitting diode of the invention has an inorganic insulative hole injecting and transporting layer between the light emitting layer and the positive electrode. The inorganic insulative hole injecting and transporting layer contains silicon oxide and/or germanium oxide as the main component.

Preferably the main component has an average composition represented by the formula:

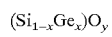

$(Si_{1-x}Ge_x)O_y$ wherein $0 \leq x \leq 1$ and $1.7 \leq y \leq 1.99$, typically as analyzed by Rutherford back-scattering.

By controlling the oxide as the main component of the inorganic insulative hole injecting and transporting layer so as to fall in the above-defined compositional range, it becomes possible to effectively inject holes from the positive electrode to the light emitting layer side. Additionally, the migration of electrons from the light emitting layer to the positive electrode is restrained, ensuring effective recombination of holes and electrons in the light emitting layer. Since hole injection and transportation is intended, no light emission occurs with a reverse bias voltage applied. The device of the invention is effectively applicable to displays of the time-division drive mode which are required to produce a high emission luminance.

The light emitting diode of the invention produces a luminance comparable to that of prior art organic EL devices and LEDs. Owing to high heat resistance and weather resistance, the light emitting diode of the invention has a longer service life than the prior art devices and develops neither leaks nor dark spots. The use of inexpensive, readily available inorganic materials rather than relatively expensive organic materials offers the advantages of easy manufacture and a reduced manufacture cost.

In the formula, y representative of the oxygen content is in the above range, that is, from 1.7 to 1.99. If y is outside this range, the layer has a reduced hole injecting capability, leading to a drop of luminance. Preferably y is from 1.85 to 1.98.

The inorganic insulative hole injecting and transporting layer may be a thin film of silicon oxide, germanium oxide, or a mixture of silicon oxide and germanium oxide. In the formula, x representative of the germanium to silicon ratio is $0 \leq x \leq 1$. Preferably x is up to 0.4, more preferably up to 0.3, especially up to 0.2.

Alternatively, x is preferably at least 0.6, more preferably at least 0.7, especially at least 0.8.

The oxygen content is given as an average value for the film as analyzed by Rutherford back-scattering although the measurement method is not limited thereto. Any analysis may be used insofar as measurement is made at an equivalent precision.

The inorganic insulative hole injecting and transporting layer may contain as an impurity Ne, Ar, Kr or Xe used as the sputtering gas, preferably in a total content of up to 10 at %, more preferably 0.01 to 2% by weight, especially 0.05 to 1.5% by weight. These elements may be contained alone or in admixture of two or more. The mixture may be of two or more impurity elements in an arbitrary ratio.

These elements are used as the sputtering gas and thus introduced into the inorganic insulative hole injecting and transporting layer during its formation. If the content of these elements is too high, the trapping effect is extremely lowered and hence, the desired performance is lost.

The content of the sputtering gas is determined by the pressure, the flow rate ratio of sputtering gas to oxygen, deposition rate, and other factors during film formation, especially the pressure during film formation. In order that the content of the sputtering gas fall within the above-described range, it is preferred to effect film deposition in higher vacuum, specifically in a vacuum of 1 Pa or lower, especially 0.1 to 1 Pa.

As long as the overall inorganic insulative hole injecting and transporting layer has the above-described composition on the average, the composition of the layer need not be uniform. A layer structure having a graded concentration in a thickness direction is acceptable. In this case, the hole injecting and transporting layer is preferably oxygen poorer on the interface side with the inorganic layer (or light emitting layer).

The inorganic insulative hole injecting and transporting layer is normally amorphous.

The thickness of the inorganic insulative hole injecting and transporting layer is not critical although an appropriate thickness is about 0.05 to 10 nm, more preferably about 0.1 to 5 nm, and especially about 1 to 5 nm or about 0.5 to 3 nm. Hole injection would become insufficient when the thickness of the inorganic insulative hole injecting and transporting layer is outside the range.

Methods for preparing the inorganic insulative hole injecting and transporting layer include various physical and chemical thin film formation methods such as sputtering and electron beam (EB) evaporation, with the sputtering being preferred.

When the inorganic insulative hole injecting layer is formed by sputtering, the sputtering gas is preferably under a pressure of 0.1 to 1 Pa during sputtering. The sputtering gas may be an inert gas such as Ar, Ne, Xe or Kr as used in conventional sputtering apparatus. Nitrogen ($N_2$) may be used if desired. As to the sputtering atmosphere, about 1 to 99% of oxygen ($O_2$) may be added to or mixed with the sputtering gas to carry out reactive sputtering. The above-described oxide is used as the target and either single or multiple source sputtering may be carried out.

The sputtering process may be a high-frequency sputtering process using an RF power supply or a dc reactive sputtering process, with the RF sputtering being preferred. The power to the sputtering apparatus is preferably in the range of about 0.1 to 10 W/cm$^2$ for RF sputtering. The rate of film deposition is preferably in the range of 0.5 to 10 nm/min, especially 1 to 5 nm/min. During deposition, the temperature of the substrate is room temperature (25° C.) to about 150° C.

Reactive sputtering is acceptable. When nitrogen is incorporated, the reactive gas may be $N_2$, $NH_3$, NO, $NO_2$, $N_2O$, etc. When carbon is incorporated, the reactive gas may be $CH_4$, $C_2H_2$, CO, etc. These reactive gases may be used alone or in admixture of two or more.

By providing the inorganic hole injecting and transporting layer, the light emitting diode of the invention is improved in heat resistance and weather resistance so that it has a longer lifetime. Since an inexpensive, readily available inorganic material is used rather than a relatively expensive organic material, the manufacturing procedure becomes easy and the manufacturing cost can be reduced. The connection to the electrode of inorganic material is improved. This restrains the development of current leakage or dark spots.

The light emitting layer may be formed of the same materials as used in conventional EL devices.

The preferred materials for the light emitting layer are those described in Shosaku Tanaka, "Recent Technical Trend of Displays," in monthly magazine Display, April 1998, pp. 1–10. More specifically, ZnS and Mn/CdSSe are typical materials for red light emission, ZnS:TbOF, ZnS:Tb, and ZnS:Tb are typical materials for green light emission, and SrS:Ce, $(SrS:Ce/ZnS)_n$, $CaGa_2S_4$:Ce, and $Sr_2Ga_2S_5$:Ce are typical materials for blue light emission.

Also known for white light emission are SrS:Ce/ZnS:Mn etc.

Of these, better results are obtained using a blue light emitting layer of SrS:Ce discussed in the International Display Workshop (IDW) '97, X. Wu "Multicolor Thin-Film Ceramic Hybrid EL Displays," pp. 593 to 596.

The thickness of the light emitting layer is not critical although too thick layers lead to an increased drive voltage and too thin layers lead to a reduced luminous efficiency. The specific thickness is about 100 to 1,000 nm, especially about 150 to 500 nm although it depends on the fluorescent material used.

The light emitting layer may be formed by gas phase deposition processes. The gas phase deposition processes include physical vapor phase deposition processes such as sputtering and evaporation, and chemical vapor phase deposition processes such as CVD. Of these, the chemical vapor phase deposition processes such as CVD are preferable.

As described in the above-referred IDW, for the formation of the light emitting layer of SrS:Ce, a light emitting layer of high purity is obtained by forming it in a H$_2$S atmosphere by an electron beam evaporation process.

The formation of the light emitting layer is preferably followed by heat treatment. The heat treatment may be carried out after the electrode layers (positive/negative electrodes) and the light emitting layer are formed on a substrate, or cap annealing may be carried out after the electrode layer, the light emitting layer and the electrode layer are formed on a substrate. Often the use of cap annealing is preferred. The temperature of heat treatment is preferably from 600° C. to the sintering temperature of the substrate, more preferably from 600 to 1,300° C., most preferably from 800 to 1,200° C. and the treating time is from about 10 to 600 minutes, especially from about 30 to 180 minutes. The atmosphere for annealing may be N$_2$, Ar, He, or N$_2$ containing not more than 0.1% of O$_2$.

The light emitting diode of the invention may have a high resistance inorganic hole injecting and transporting layer as the inorganic hole injecting and transporting layer between the light emitting layer and the hole injecting layer.

By disposing a high resistance inorganic hole injecting and transporting layer having hole conduction paths and capable of blocking electrons between the inorganic light emitting layer and the positive electrode (or hole injecting electrode) in this way, there are obtained advantages including efficient injection of holes into the inorganic light emitting layer, improved luminous efficiency, and a low drive voltage.

Preferably in the high resistance inorganic hole injecting and transporting layer, an oxide of a metal or metalloid such as silicon or germanium is used as the main component, and at least one of metals, metalloids, and/or oxides, carbides, nitrides, silicides and borides thereof, having a work function of at least 4.5 eV, preferably 4.5 to 6 eV, is contained therein to create conduction paths, thereby enabling efficient injection of holes from the hole injecting electrode to the inorganic light emitting layer side. Additionally, this restrains the motion of electrons from the inorganic light emitting layer to the hole injecting electrode side, enabling efficient recombination of holes and electrons in the inorganic light emitting layer.

The high resistance inorganic hole injecting and transporting layer preferably has a resistivity of 1 to $1 \times 10^{11}$ Ω-cm, and especially $1 \times 10^3$ to $1 \times 10^8$ Ω-cm. The resistivity of the high resistance inorganic hole injecting and transporting layer selected within the range permits the hole injection efficiency to be drastically improved while maintaining high electron blockage. The resistivity of the high resistance inorganic hole injecting and transporting layer may also be determined from a sheet resistance and a film thickness. The sheet resistance may be measured by a four-terminal method or the like.

The materials used as the main component are oxides of silicon and germanium. Preferably the main component is represented by

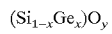

wherein $0 \leq x \leq 1$ and $1.7 \leq y \leq 2.2$, preferably $1.7 \leq y \leq 1.99$. The main component of the high resistance inorganic hole injecting and transporting layer may be silicon oxide, germanium oxide or a mixture of silicon oxide and germanium oxide. If y is outside this range, the layer tends to reduce its hole injecting function. The composition may be determined by Rutherford back-scattering or chemical analysis, for example.

In addition to the main component, the high resistance inorganic hole injecting and transporting layer preferably contains one or more of oxides, carbides, nitrides, silicides and borides of metals (inclusive of metalloids) having a work function of at least 4.5 eV. The metal having a work function of at least 4.5 eV, preferably 4.5 to 6 eV is at least one element selected from among Au, Cu, Fe, Ni, Ru, Sn, Cr, Ir, Nb, Pt, W, Mo, Ta, Pd, and Co. These elements are generally present in the form of metals or oxides. Carbides, nitrides, silicides or borides of these metals are also acceptable. When they are used in admixture, the mixing ratio is arbitrary. The content of these elements is preferably 0.2 to 40%, more preferably 1 to 20 mol %. Outside the range, less contents lead to a poor hole injecting function and larger contents lead to a poor electron blocking function. When two or more elements are used in combination, the total content should preferably fall in the above range.

The above-described metals or oxides, carbides, nitrides, silicides and borides of metals (inclusive of metalloids) are usually dispersed in the high resistance inorganic hole injecting and transporting layer. The dispersed particles generally have a particle size of about 1 to 5 nm. It is believed that a hopping path is created between the dispersed particles of conductor for carrying holes by way of the high resistance main component.

The high resistance inorganic hole injecting and transporting layer may contain as impurities H and Ne, Ar, Kr or Xe used as the sputtering gas, preferably in a total content of up to 5 at %.

As long as the overall high resistance inorganic hole injecting and transporting layer has the above-described composition on the average, the composition of the layer need not be uniform. A layer structure having a graded concentration in a thickness direction is acceptable.

The high resistance inorganic hole injecting and transporting layer is normally amorphous.

The thickness of the high resistance inorganic hole injecting and transporting layer is preferably about 0.2 to 100 nm, more preferably about 0.2 to 30 nm, most preferably about 0.2 to 10 nm. Outside the range, the high resistance inorganic hole injecting and transporting layer would fail to fully exert its own function.

Methods for preparing the high resistance inorganic hole injecting and transporting layer include various physical and chemical thin film formation methods such as sputtering and evaporation, with the sputtering being preferred. In particular, a multi-source sputtering process of sputtering distinct targets of the main component and the metal, metal oxide or the like is preferred. The multi-source sputtering process allows the respective targets to be sputtered by appropriate techniques. In the case of single-source sputtering, the composition may be controlled by placing a small piece of the metal, metal oxide or the like on a target of the main component and properly adjusting the area ratio of the piece to the target.

When the high resistance inorganic hole injecting and transporting layer is formed by sputtering, the depositing conditions are the same as in the case of the high resistance inorganic electron injecting and transporting layer.

Referring to FIG. 1, the light emitting diode of the invention may have the successively stacked configuration of substrate 1/hole injecting electrode 2/inorganic hole injecting and transporting layer 3/light emitting layer 4/inorganic insulative electron injecting and transporting layer 5/negative electrode (or electron injecting electrode) 6. The configuration obtained by reversing the above-described order of stacking, that is, the inversely stacked configuration is also acceptable. With respect to the stacked configuration, an appropriate embodiment may be selected depending on the specifications and manufacturing process of a display.

The devices of the invention may be stacked in multiple stages in the film thickness direction. Such a multi-stage configuration is effective for adjusting or multiplying the color of emitted light.

Further preferably, a shield plate may be provided on the device in order to prevent the organic layers and electrodes from deterioration. In order to prevent the ingress of moisture, the shield plate is attached to the substrate through an adhesive resin layer for sealing. The sealing or filler gas is preferably an inert gas such as argon, helium, and nitrogen. The filler gas should preferably have a moisture content of up to about 100 ppm, more preferably up to about 10 ppm, especially up to about 1 ppm. The lower limit of the moisture content is usually about 0.1 ppm though not critical.

The shield plate is selected from plates of transparent or translucent materials such as glass, quartz and resins, with glass being especially preferred. Alkali glass is preferred because of economy although other glass compositions such as soda lime glass, lead alkali glass, borosilicate glass, aluminosilicate glass, and silica glass are also useful. Of these, plates of soda glass without surface treatment are inexpensive and useful. Metal plates and plastic plates may also be used as the shield plate.

Using a spacer for height adjustment, the shield plate may be held at a desired height over the layer structure. When a shield plate having a recess is used, the spacer may be used or not. When used, the spacer should preferably have a diameter in the above-described range, especially 2 to 8 $\mu$m.

The spacer may be premixed in a sealing adhesive or mixed with a sealing adhesive at the time of bonding. The content of the spacer in the sealing adhesive is preferably 0.01 to 30% by weight, more preferably 0.1 to 5% by weight.

Any adhesive which can maintain stable bond strength and gas tightness may be used although UV-curable epoxy resin adhesives of cation curing type are preferred.

The substrate on which the light emitting diode is formed may be selected from amorphous substrates of glass and quartz and crystalline substrates of Si, GaAs, ZnSe, ZnS, GaP, and InP, for example. If desired, buffer layers of crystalline materials, amorphous materials or metals may be formed on such crystalline substrates. Metal substrates including Mo, Al, Pt, Ir, Au and Pd are also useful. Of these, glass substrates are preferred. When the substrate is situated on the light output side, the substrate should preferably have a light transmittance as described above for the electrode.

A plurality of inventive devices may be arrayed on a plane. A color display is obtained when the respective devices of a planar array differ in emission color.

The substrate may be provided with a color filter film, a fluorescent material-containing color conversion film or a dielectric reflecting film for controlling the color of light emission.

The light emitting diode of the invention is generally used as an EL device of the dc or pulse drive type while it can be of the ac drive type. The applied voltage is generally about 2 to 30 volts.

The light emitting diode of the invention is applicable as displays, optical pickups for use in writing and reading of memories, repeaters in transmission lines for optical communication, photocouplers, and other optical devices.

EXAMPLE

Example 1

A substrate of (7059) glass by Corning Glass Works was scrubbed using a neutral detergent.

By RF magnetron sputtering from a target of ITO oxide, a hole injecting electrode layer of ITO having a thickness of 200 nm was formed on the substrate at a temperature of 250° C.

After its ITO electrode-bearing substrate surface was cleaned with $UV/O_3$, the substrate was secured by a holder in a sputtering chamber, which was evacuated to a vacuum of $1 \times 10^{-4}$ Pa or lower.

Using a target of $SiO_2$, an inorganic insulative hole injecting and transporting layer was deposited to a thickness of 2 nm. The sputtering gas used was Ar having 5% of $O_2$ admixed therewith. Sputtering conditions included a substrate temperature of 25° C., a deposition rate of 1 nm/min, an operating pressure of 0.5 Pa, and an input power of 5 W/cm$^2$. The hole injecting layer as deposited had a composition of $SiO_{1.9}$.

With the vacuum kept, the substrate was transferred from the sputtering chamber to the evaporating chamber where by co-evaporation of ZnS and Mn, ZnS:Mn was vacuum evaporated to a thickness of 0.3 $\mu$m. By heating in Ar at 650 to 750° C. for 2 hours, the layer was annealed for improving its characteristics.

Next, with the vacuum kept, the substrate was transferred to the sputtering chamber where using a target obtained by mixing strontium oxide (SrO), lithium oxide ($Li_2O$) and silicon oxide ($SiO_2$) in such amounts that the target consisted of SrO: 80 mol %,
$Li_2O$: 10 mol %, and
$SiO_2$: 10 mol %, an inorganic insulative electron injecting and transporting layer was deposited to a thickness of 0.8 nm. Depositing conditions included a substrate temperature of 25° C., a sputtering gas of Ar, a deposition rate of 1 nm/min, an operating pressure of 0.5 Pa, and an input power of 5 W/cm$^2$. The inorganic insulative electron injecting and transporting layer was first deposited to a thickness of 0.4 nm while supplying 100 SCCM of 100% Ar as the sputtering gas, and then to a thickness of 0.4 nm while supplying 100 SCCM of a mixture of $Ar/O_2$ (1/1).

With the vacuum kept, Al was evaporated to a thickness of 200 nm to form a negative electrode. Finally, a glass shield was sealed to complete a light emitting diode.

The light emitting diode thus obtained was driven in air at a constant current density of 10 mA/cm$^2$, finding a drive voltage of 10 volts and an initial luminance of 500 cd/m$^2$.

Example 2

In Example 1, the main component and stabilizer of the inorganic insulative electron injecting and transporting layer were changed from SrO to MgO, CaO or mixtures of these oxides, from $Li_2O$ to $K_2O$, $Rb_2O$, $K_2O$, $Na_2O$, $Cs_2O$ or mixtures of these oxides, and from $SiO_2$ to $GeO_2$ or oxide mixtures of $SiO_2$ and $GeO_2$, respectively, with substantially equivalent results.

Example 3

Light emitting diodes were fabricated as in Example 1 except that in the step of depositing the inorganic insulative hole injecting and transporting layer, the composition of the target was changed to $SiO_2$ and the flow rate of $O_2$ in the sputtering gas was controlled to give a mixing ratio of 5% $O_2$ based on Ar so that the layer had a composition of $SiO_{1.9}$; the composition of the target was changed to $SiO_2$ and the flow rate of $O_2$ in the sputtering gas was controlled to give a mixing ratio of 30% $O_2$ based on Ar so that the layer had a composition of $SiO_{1.95}$; the composition of the target was changed to $GeO_2$ and the flow rate of $O_2$ in the sputtering gas was controlled to give a mixing ratio of 30% $O_2$ based on Ar so that the layer had a composition of $GeO_{1.96}$; and the composition of the target was changed to $Si_{0.5}Ge_{0.5}O_2$ and the flow rate of $O_2$ in the sputtering gas was controlled to give a mixing ratio of 10% $O_2$ based on Ar so that the layer had a composition of $Si_{0.5}Ge_{0.5}O_{1.92}$. The diodes were evaluated as in Example 1.

All the light emitting diodes were found to provide substantially equivalent results to Example 1.

Example 4

Instead of depositing the inorganic insulative hole injecting and transporting layer in Example 1, a high resistance inorganic hole injecting and transporting layer was deposited to a thickness of 2 nm using a target of $SiO_2$ have a Au pellet of the predetermined size rested thereon. The sputtering gas used was a mixture of 30 sccm of Ar and 5 sccm of $O_2$. Sputtering conditions included room temperature (25° C.), a deposition rate of 1 nm/min, an operating pressure of 0.2–2 Pa, and an input power of 500 W. The high resistance inorganic hole injecting and transporting layer as deposited had a composition of $SiO_{1.9}$ containing 4 mol % of Au.

The inorganic EL device thus obtained was driven in air at a constant current density of 10 mA/cm$^2$, finding a drive voltage of 10 volts and an initial luminance of 500 cd/m$^2$. By the four-terminal method, the sheet resistance of the high resistance inorganic hole injecting and transporting layer was measured. The layer had a sheet resistance of 3 kΩ/cm$^2$ at a thickness of 100 nm, which correspond to a resistivity of $3 \times 10^8$ Ω-cm.

Example 5

In the step of depositing the high resistance inorganic hole injecting and transporting layer in Example 4, a high resistance inorganic hole injecting and transporting layer was deposited to a thickness of 20 nm using a target of $GeO_2$ have a Au pellet of the predetermined size rested thereon. The sputtering gas used was a mixture of 30 sccm of Ar and 5 sccm of $O_2$. Sputtering conditions included room temperature (25° C.), a deposition rate of 1 nm/min, an operating pressure of 0.2–2 Pa, and an input power of 500 W. The inorganic hole injecting and transporting layer as deposited had a composition of $GeO_2$ containing 2 mol % of Au.

Otherwise as in Example 1, a light emitting diode was manufactured. When the diode was evaluated as in Example 1, approximately equivalent results to Example 1 were obtained.

Example 6

Inorganic EL devices were fabricated as in Example 4 except that in the step of depositing the high resistance inorganic hole injecting and transporting layer, the composition of the main component of the layer was changed to $SiO_{1.7}$, $SiO_{1.95}$, $GeO_{1.96}$, and $Si_{0.5}Ge_{0.5}O_{1.92}$ by controlling the flow rate of $O_2$ in the sputtering gas and the target in accordance with the desired film composition. When the devices were evaluated for the luminance of light emission, approximately equivalent results were obtained.

Example 7

Equivalent results were obtained when the metal of the high resistance inorganic hole injecting and transporting layer in Example 4 was changed from Au to at least one member of Cu, Fe, Ni, Ru, Sn, Cr, Ir, Nb, Pt, W, Mo, Ta, Pd and Co or an oxide, carbide, nitride, silicide or boride thereof.

BENEFITS OF THE INVENTION

According to the invention, a light emitting diode is accomplished which enables relatively easy fabrication of large-area displays and is applicable to thin, long life, low cost, full color displays too.

What is claimed is:

1. A light emitting diode comprising
a positive electrode, a negative electrode, an inorganic light emitting layer disposed between the electrodes exhibiting at least electroluminescence,
an inorganic insulative electron injecting and transporting layer disposed between said inorganic light emitting layer and said negative electrode and comprising as a main component at least one oxide selected from the group consisting of strontium oxide, magnesium oxide, calcium oxide, lithium oxide, rubidium oxide, potassium oxide, sodium oxide, and cesium oxide, and
an inorganic hole injecting and transporting layer disposed between said inorganic light emitting layer and said positive electrode, said inorganic hole injecting and transporting layer being an inorganic insulative hole injecting and transporting layer comprising an oxide of silicon and/or germanium as a main component.

2. The light emitting diode of claim 1 wherein the main component has an average composition represented by $(Si_{1-x}Ge_x)O_y$, wherein $0 \leq x \leq 1$ and $1.7 \leq y \leq 1.99$.

3. The light emitting diode of claim 1 wherein said inorganic insulative electron injecting and transporting layer further contains silicon oxide ($SiO_2$) and/or germanium oxide ($GeO_2$) as a stabilizer.

4. The light emitting diode of claim 1 wherein said inorganic insulative electron injecting and transporting layer contains
80 to 99 mol % of the main component and
1 to 20 mol % of the stabilizer, based on the entire components.

5. The light emitting diode of claim 1 wherein said inorganic insulative electron injecting and transporting layer has a thickness of 0.1 to 2 nm.

6. The light emitting diode of claim 1 wherein said inorganic insulative hole injecting and transporting layer has a thickness of 0.1 to 3 nm.

7. The light emitting diode of claim 1 wherein said inorganic hole injecting and transporting layer is a high resistance inorganic hole injecting and transporting layer having a resistivity of 1 to $1 \times 10^{11}$ Ω-cm.

8. The light emitting diode of claim 7 wherein said high resistance inorganic hole injecting and transporting layer contains a metal and/or at least one member selected from the group consisting of an oxide, carbide, nitride, silicide and boride of the metal.

9. The light emitting diode of claim 7 wherein said high resistance inorganic hole injecting and transporting layer contains
an oxide of silicon and/or germanium as a main component, the main component being represented by $(Si_{1-x}Ge_x)O_y$, wherein $0 \leq x \leq 1$ and $1.7 \leq y \leq 2.2$, and
a metal having a work function of at least 4.5 eV and/or at least one member selected from the group consisting of an oxide, carbide, nitride, silicide and boride of the metal.

10. The light emitting diode of claim 9 wherein said metal is at least one member selected from the group consisting of Au, Cu, Fe, Ni, Ru, Sn, Cr, Ir, Nb, Pt, W, Mo, Ta, Pd, and Co.

11. The light emitting diode of claim 9 wherein the content of the metal and/or the oxide, carbide, nitride, silicide and boride of the metal is 0.2 to 40 mol %.

12. The light emitting diode of claim 9 wherein said high resistance inorganic hole injecting and transporting layer has a thickness of 0.2 to 100 nm.

13. The light emitting diode of claim 1 wherein said inorganic light emitting layer contains at least strontium sulfide and cesium.

* * * * *